United States Patent
Yang

[19]

[11] Patent Number: 5,889,707
[45] Date of Patent: Mar. 30, 1999

[54] OUTPUT BUFFER OF SEMICONDUCTOR MEMORY DEVICE

[75] Inventor: Chul Hwan Yang, Kyoungki-do, Rep. of Korea

[73] Assignee: Hyundai Electronics Industries Co., Ltd., Kyoungki-do, Rep. of Korea

[21] Appl. No.: 102,908

[22] Filed: Jun. 23, 1998

[30] Foreign Application Priority Data

Jun. 24, 1997 [KR] Rep. of Korea ................... 1997 26976

[51] Int. Cl.⁶ .................................................. G11C 7/00
[52] U.S. Cl. .............................. 365/189.05; 365/189.11; 365/191; 326/68; 326/83
[58] Field of Search ......................... 365/189.05, 189.11, 365/191; 326/63, 68, 80, 82, 83

[56] References Cited

U.S. PATENT DOCUMENTS

| | | | |
|---|---|---|---|
| 5,311,076 | 5/1994 | Park et al. ................................ | 307/443 |
| 5,617,043 | 4/1997 | Han et al. ................................ | 326/83 |
| 5,654,648 | 8/1997 | Medhekar et al. ..................... | 326/83 X |
| 5,703,811 | 12/1997 | Yoo et al. ........................... | 365/189.05 |
| 5,703,812 | 12/1997 | Ryu ..................................... | 365/189.05 |
| 5,708,608 | 1/1998 | Park et al. .......................... | 365/189.05 |
| 5,773,999 | 6/1998 | Park et al. ............................. | 326/83 X |
| 5,786,711 | 7/1998 | Choi ......................................... | 326/83 |
| 5,798,969 | 8/1998 | Yoo et al. ........................... | 365/189.05 |

*Primary Examiner*—Do Hyun Yoo
*Attorney, Agent, or Firm*—Jacobson, Price, Holman & Stern, PLLC

[57] ABSTRACT

An output buffer of semiconductor memory device is provided for improving the operation speed and for reducing an output noise. The output buffer in accordance with this invention includes an output node driver having a pull-up transistor and a pull-down transistor for pulling-up or pulling-down an output node; a data input circuit for receiving a data to be outputted from a sense amplifier during a reading operation, in response to an output enable signal and a preset signal; a preset input circuit for receiving an output signal of the output node driver during a preset period before the data is applied to the data input circuit in response to the output enable signal and the preset signal; and a driving circuit for receiving signals produced from the data input circuit and the preset input circuit and for driving the pull-up transistor and the pull-down transistor.

6 Claims, 2 Drawing Sheets

OUTPUT BUFFER OF SEMICONDUCTOR MEMORY DEVICE

BACKGROUND OF THE INVENTION

The present invention relates to an output buffer of semiconductor memory device with high integration, which externally produces a sensed cell data, in particularly to an output buffer for preventing a shifting delay of an output signal by presetting the output of the output buffer.

FIG. 1 is a circuit diagram of a conventional output buffer, which is composed of a driver unit 10 and a logic circuit unit 12. The driver unit 10 is composed of a pull-up transistor (PMOS transistor, PM) for pulling-up the output node N1, a pull-down transistor(NMOS transistor, NM) for pulling-down the output node N1. The logic circuit unit 12 controls the pull-up and the pull-down transistors PM and NM based on the logic combination of a data /DATA to be outputted and an output enable signal OE.

Here, the logic circuit unit 12 is composed of an inverter IV1 for receiving the data /DATA so as to invert it, a NAND gate NAG1 for performing a logic-NAND operation with respect to the output enable signal OE and the data DATA produced from the inverter IV1, and a NOR gate NOG1 for performing a logic-NOR operation with respect to the data DATA from the inverter IV1 and an inverted output enable signal /OE.

The operation of the output buffer of semiconductor memory device as above are as follows.

In case the output enable signal OE is low, the output of the NAND gate NAG1 is high level which is, in turn, applied to the gate of the pull-up transistor PM, and the output of the NOR gate NOG1 is low level which is, in turn, applied to the gate of the pull-down transistor NM. As a result, the pull-up transistor PM and the pull-down transistor NM are turned off so that the output node is floating.

Meanwhile, in case the output enable signal OE is high, the outputs of the NAND gate NAG1 and the NOR gate NOG1 are determined based on the logic level of the data DATA produced from the inverter IV1. That is, when the data DATA is low level, the output of the NAND gate NAG1 is high level which is applied to the gate of the pull-up transistor PM so as to be turned off. In addition, the gate of the pull-down transistor NM is applied with the high level signal from the NOR gate NOG1, so that the pull-down transistor NM is turned on to pull-down the output node N1 which produces a low level signal.

Alternatively, when the data DATA is high level, the NAND gate NAG1 produces a low level signal which is applied to the gate of the pull-up transistor PM, and the NOR gate NOG1 produces a low level signal which is applied to the gate of the pull-down transistor NM. Thus, the pull-up transistor PM is turned on and the pull-down transistor NM is turned off, so that the output node N1 is driven by pulling-up operation of the pull-up transistor PM and the high level signal is outputted.

The conventional output buffer as above, however, has a problem that the output signal OUT is fully swung between a ground level and a power supply voltage level, which causes the delay of the output signal changeover due to the deep swing voltage depth, thereby reducing the overall operation speed. Also, an output noise is generated due to the current flowing therein in order to drive an capacitor(which serves as a load) coupled in general to the output node of the output buffer, so that the other circuits may be malfunctioned.

SUMMARY OF THE INVENTION

The present invention is for solving the above problems and has an object to provide an output buffer of semiconductor memory device which improves the operation speed and reduces the output noise.

To accomplish the above object of the present invention, there is provided with an output buffer of semiconductor memory device comprising an output node driver having a pull-up transistor and a pull-down transistor for pulling-up or pulling-down an output node; a data input means for receiving a data to be outputted from a sense amplifier during a reading operation, in response to an output enable signal and a preset signal; a preset input means for receiving an output signal of the output node driver during a preset period before the data is applied to the data input means in response to the output enable signal and the preset signal; and a driving means for receiving signals produced from the data input means and the preset input means and for driving the pull-up transistor and the pull-down transistor.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

The preferred embodiment of the present invention will hereinafter be described in detail with reference to FIGS. 2, 3A and 3B.

Figure 1:
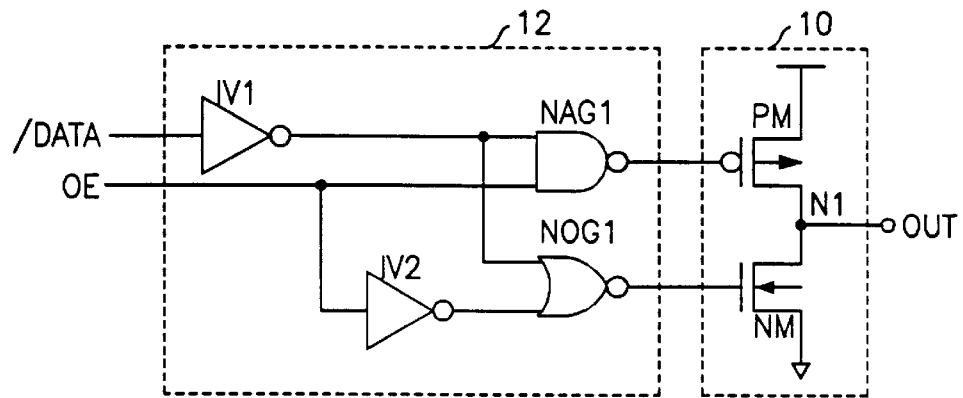
FIG. 1 is a circuit diagram of a conventional output buffer of semiconductor memory device.
Figure 2:
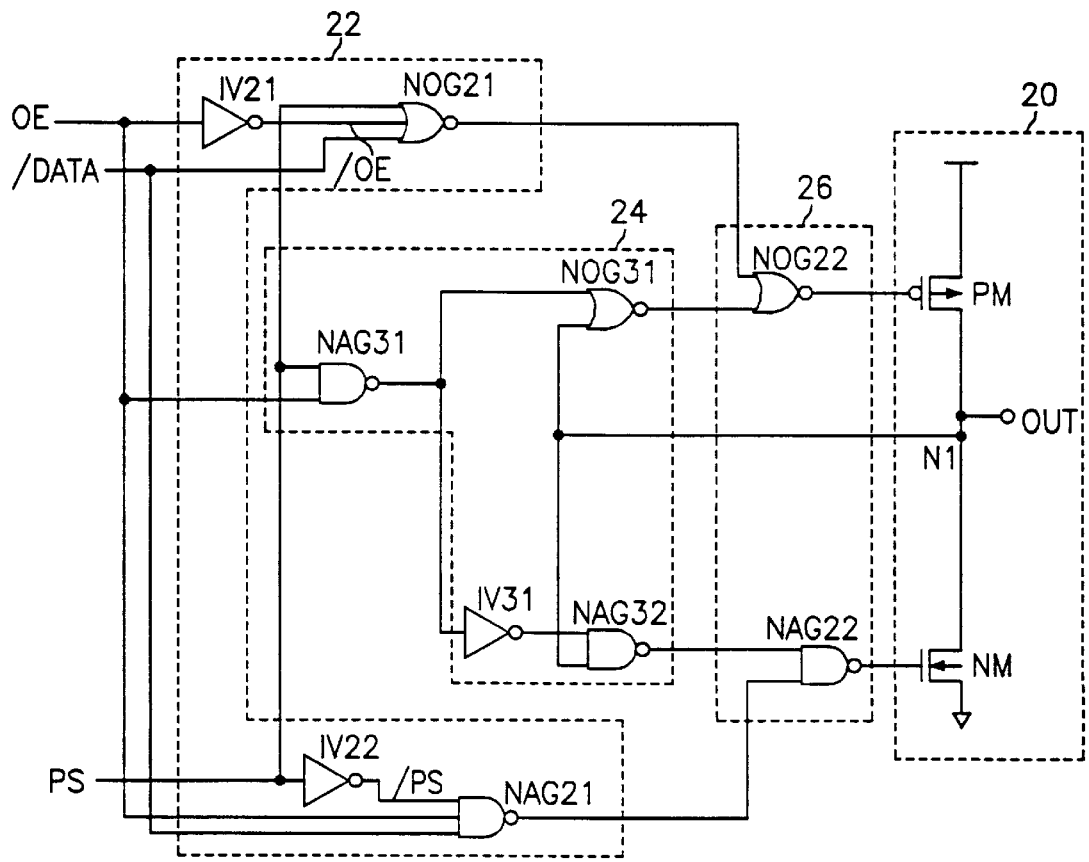
FIG. 2 is a circuit diagram of an output buffer of semiconductor memory device according to one embodiment of the present invention.

FIG. 2 is a circuit diagram of an output buffer of a semiconductor memory device according to one embodiment of the present invention.

Referring to FIG. 2, the output buffer of the present invention comprises an output node driver 20, a data input unit 22, a preset input unit 24 and a driving unit 26. The output node driver 20 includes a pull-up transistor PM for pull-up driving the output node N1 and a pull-down transistor NM for pull-down driving the output node N1. The data input unit 22 receives an inverted data /DATA from a sense amplifier(not shown) in response to the output enable signal OE and a preset signal PS. The preset input unit 24 receives the signal of the output node N1 during until a data being applied to the data input unit 22, in response to the output enable signal OE and the preset signal PS. The driving unit 26 drives the gates of the pull-up transistor PM and the pull-down transistor NM based on the signals produced from the data input unit 22 and the preset input unit 24.

Here, the data input unit 22 includes an inverter IV21 for inverting the output enable signal OE; a NOR gate NOG21 for performing a logic NOR operation with respect to the inverted output enable signal /OE produced from the inverter IV21, the inverted data /DATA and the preset signal PS; and a NAND gate NAG21 for performing a logic NAND operation with respect to the inverted preset signal /PS produced from the inverter IV22, the output enable signal OE and the inverted data /DATA.

The preset input unit 24 includes a NAND gate NAG31 for performing a logic NAND operation with respect to the output enable signal OE and the preset signal PS ; a NOR gate NOG31 for performing a logic NOR operation with respect to the signal produced from the NAND gate NAG31 and the signal feedback-applied from the output node N1; an inverter IV31 for inverting the signal produced from the NAND gate NAG31; and a NAND gate NAG32 for performing a logic NAND operation with respect to the signal produced from the inverter IV31 and the signal feedback-applied from the output node N1.

The driving unit 26 comprises a NOR gate NOG22 for performing a logic NOR operation with respect to the signal produced from the NOR gate NOG21 and the signal produced from the NOR gate NOG31; and a NAND gate NAG22 for performing a logic NAND operation with respect to the signal produced from the NAND gate NAG21 and the signal produced from the NAND gate NAG32.

The operation of the output buffer in accordance with the present invention is as follows.

When the output enable signal OE externally applied is low level, the NAND gate NAG31 of the preset input unit 24 produces a high level signal to the NOR gate NOG31 and the inverter IV31. Also, the NOR gate NOG31 produces a low level signal based on the high level signal applied thereto and then applies it to the NOR gate NOG22 of the driving unit 26. The inverter IV31, also inverts the output signal of the NAND gate NAG31 to a low signal and then applies the low signal to the NAND gate NAG32. The NAND gate NAG32 produces a high level signal to the NAND gate NAG22 based on the low signal applied thereto. In addition, the NOR gate NOG21 of the data input unit 22 produces a low signal and the NAND gate NAG21 produces a high level signal, respectively, by the low level of the output enable signal OE.

Accordingly, the NOR gate NOG22 of the driving unit 26 applies a high level signal to the gate of the pull-up transistor PM so as to be turned off and the NAND gate NAG22 applies a low level signal to the gate of the pull-down transistor NM to be turned off. In other words, when the low level of the output enable signal OE is applied, all of the transistors PM and NM of the output node driver 20 are turned off irrespective of the preset signal PS, the inverted data /DATA and the feedback signal from the common output node N1, so that no data can be outputted.

Next, when a high level of the output enable signal OE and a low level of the preset signal PS are externally applied, the NAND gate NAG31 of the preset input unit 24 produces a high level signal to the NOR gate NOG31 and the inverter IV31. Also, the NOR gate NOG31 produces a low level signal to the NOR gate NOG22 in response to the high level signal applied thereto; the inverter IV31 produces a low level signal to the NAND gate NAG32; and the NAND gate NAG32 produces a high level signal to the NAND gate NAG22 of the driving unit 26 in response to the low level signal applied thereto. At this time, the inverted data /DATA is applied through the NOR gate NOG21 of the data input unit 22 to the NOR gate NOG22 of the driving unit 26, and also is applied through the NAND gate NAG21 of the data input unit 22 to the NAND gate NAG22.

Here, the NOR gate NOG22 of the driving unit 26 is applied with a low level signal and the data signal DATA and the NAND gate NAG22 of the driving unit 26 is applied with a high level signal and the data signal DATA, so that the pull-up transistor PM or the pull-down transistor NM of the output node driver 20 should be selectively driven based on the data signal DATA. That is, when the data DATA is "high", the gates of the pull-up transistor PM and the pull-down transistor NM are applied with low level signal, respectively, so that the pull-up transistor PM is turned on while the pull-down transistor NM is turned off, thereby producing a high level signal from the output node N1. Alternatively, when the data is "low", the gates of the pull-up transistor PM and the pull-down transistor NM are applied with a high level signal, respectively, so that the pull-up transistor PM is turned off while the pull-down transistor NM is turned on, thereby producing a low level signal from the output node N1.

Therefore, the preset input unit 24 cuts off the feedback signal from the output nodes N1 by the low level of the preset signal PS and the data input unit 22 and the driving unit 26 produces the data DATA to be outputted through the output node driver 20 in response to the high level of the output enable signal OE.

Next, the high level of output enable signal OE and the high level of preset signal PS are applied and the low level signal is feedback applied from the output node N1, to the preset input unit 24, the preset input unit 24 produces a high level signal through the NOR gate NOG31 to the NOR gate NOG22. Thus, the gate of the pull-up transistor PM of the output node driver 20 is applied with a low level signal, so that the output node N1 is preset to high level.

If the high level of output enable signal OE and the high level of preset signal PS are applied and the high level signal is feedback applied from the output node N1, to the preset input unit 24, the preset input unit 24 produces a low level signal through the NAND gate NAG32 to the NAND gate NAG22 of the driving unit 26. Thus, the gate of the pull-down transistor NM of the output node driver 20 is applied with a high level signal so that the output node N1 is preset to low level.

That is, the output voltage value which has been produced from the output node N1 in the previous cycle, is feedback applied to the gate of the respective transistors of the output node driver 20, so that the output node N1 is preset to the inverse level to that of the previous cycle.

Figure 3A:
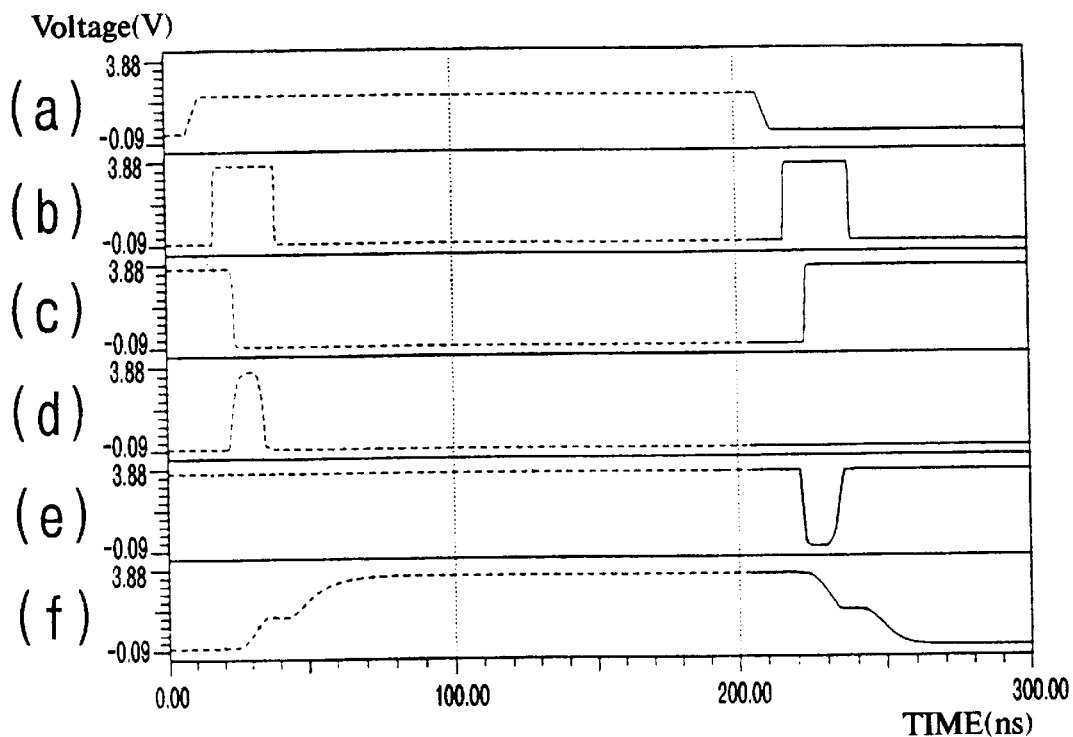
FIGS. 3A and 3B show the operation characteristics of the output buffer in accordance with the embodiments of the present invention.
Figure 3B:
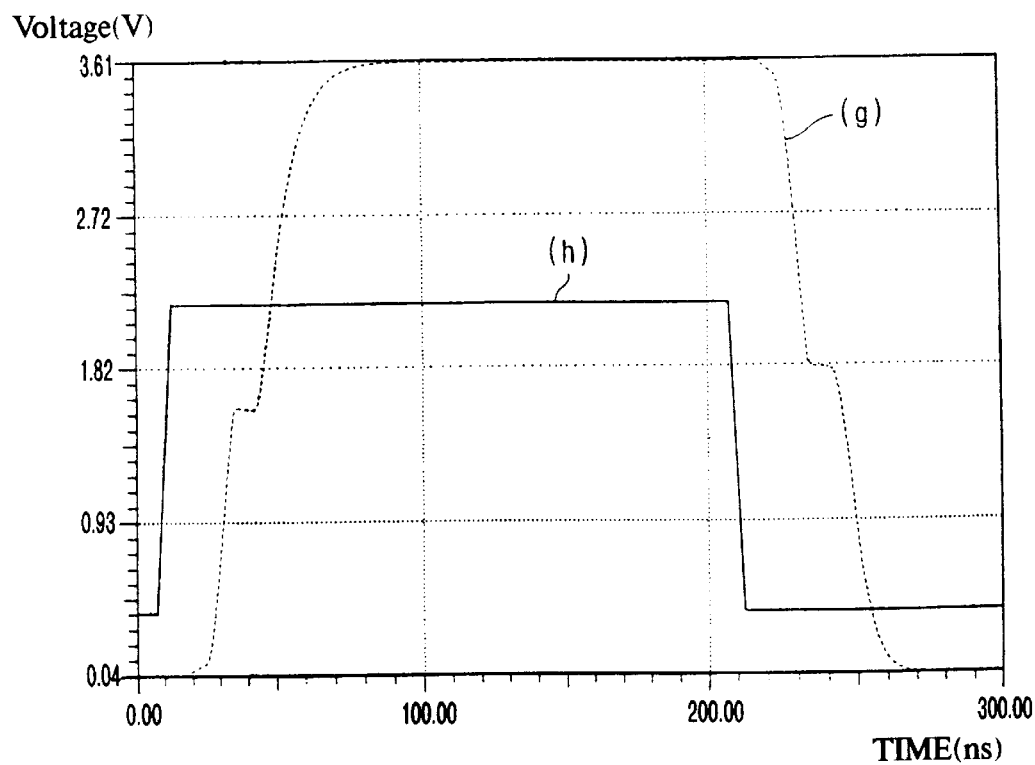

FIGS. 3A and 3B show the operation characteristics of the output buffer in accordance with the embodiments of the present invention. The operation of the output buffer in accordance with one embodiment of the present invention will be explained with reference to these drawings.

Referring to FIG. 3A, (a) represents an address transition signal which illustrates the time point when the address signal makes a transition in a semiconductor memory device; (b) represents the preset signal PS; (c) represents the inverted data signal /DATA; (d)represents the output signal of the NOR gate NOG31; (e) represents the output signal of the NAND gate NAG32 of the preset input unit 24; and (f) represents the signal of the output node N1 of the output buffer. Referring to FIG. 3B, (h) represents the address transition signal (which corresponds (a) of FIG. 3A); and (g) represents the signal of the output node N1 (which corresponds to (f) of FIG. 3A). Here, it is assumed that the output enable signal OE is always high level.

In FIGS. 3A and 3B, at the time of 10 nsec the address transition signal designated by (a) is moved to high level, so that the reading operation of a new data is started. At this time, the signal of the output node N1 in the previous cycle is a low level signal. Also, the preset signal PS is moved to high level in response to the detection of the new reading operation. The output signal (d) of the NOR gate NOG 31 is therefore moved to high level and the output signal of the NOR gate NOG22 of the driving unit 26 becomes low level so as to drive the pull-up transistor PM of the output node driver 20 for starting the presetting operation. At this time, the NOR gate NOG31 of the preset input unit 24 detects the signal of the output node N1 to produce the detection result to the NOR gate NOG22 of the driving unit 26. Here, the logic threshold voltage of the NOR gate NOG31 is controlled such that it is just lower than the preset voltage which is in general ½ power supply voltage level. Accordingly, if the level of the output node N1 reaches the logic threshold voltage, the NOR gate NOG31 produces a low level signal and the NOR gate NOG22 of the driving unit produces a high level signal, so that the pull-up transistor PM is turned off. In other words, in order to prevent the needless operation that the level of output node N1 is moved to higher than the preset voltage, if the level of the output node N1 reaches the preset voltage, the preset operation is stopped even when the preset signal PS is high level.

In addition, by producing a data during the preset operation being performed in response to the new reading operation start, the separate time for presetting is not required and also the swing time from the lowest output voltage to the highest output voltage and from the highest output voltage to the lowest output voltage is reduced, thereby reducing the time for data output.

Next, at the time point 210 nsec, the address transition signal makes a transition to start again a new data reading operation. The preset signal designated by (b) becomes high in response to the detection of the new reading operation and the signal of the output node N1 in the previous cycle is high level signal. According to this, the output signal (e) of the NAND gate NAG32 becomes low and the output signal of the NAND gate NAG22 of the driving unit 26 becomes high, so as to drive the pull-down transistor NM of the output node driver 20, thereby starting a preset operation. At this time, the NAND gate NAG32 of the preset input unit 24 detects the signal of the output node N1 and then produces the detected result to the NAND gate NAG22 of the driving unit 26. Here, the logic threshold voltage of the NAND gate NAG32 is controlled such that it is slightly higher than the preset voltage which is in general ½ power supply voltage level.

Here, for the purpose of prohibiting that a current consumption is made even in the condition that there is not any swing of the output OUT since the pull-up transistor PM and the pull-down transistor NM of the output node driver 20 are simultaneously turned on for one preset duration, or for the purpose of prohibiting that the pull-up transistor PM and the pull-down transistor NM are alternatively turned on for one preset duration, the logic threshold voltage of the NOR gate NOG31 of the preset input unit 24 is set to be slightly lower than the preset voltage and the logic threshold voltage of the NAND gate NAG32 is set to be slightly higher than the preset voltage.

As described above, the output buffer of semiconductor memory device performs the preset operation in response to the preset signal when a new reading operation starts, and produces a data during the preset operation, so that the separate time is not required for performing the preset operation and the swing time from the lowest output voltage to the highest output voltage and vice versa can be reduced, thereby reducing the time required for data output.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. An output buffer of semiconductor memory device, comprising:
   an output node driver having a pull-up transistor and a pull-down transistor for pulling-up or pulling-down an output node;
   a data input means for receiving a data to be outputted from a sense amplifier during a reading operation, in response to an output enable signal and a preset signal;
   a preset input means for receiving an output node signal of said output node driver during a preset period before the data is applied to said data input means in response to the output enable signal and the preset signal; and
   a driving means for receiving signals produced from said data input means and said preset input means and for driving said pull-up transistor and said pull-down transistor,
   and wherein said output node signal of said output node driver is preset to a mid-level between a power supply voltage and a ground voltage by said driving means during the preset period.

2. An output buffer of semiconductor memory device according to claim 1, wherein said data input means comprises:
   a first NOR means for performing a logic NOR operation with respect to an inverted output enable signal, the data and the preset signal; and
   a first NAND means for performing a logic NAND operation with respect to an inverted preset signal, the output enable signal and the data.

3. An output buffer of semiconductor memory device according to claim 2, wherein said preset input means comprises:
   a second NAND means for performing a logic NAND operation with respect to the output enable signal and the preset signal;
   a second NOR means for performing a logic NOR operation with respect to a signal produced from said second NAND means and said output node signal of said output node driver; and
   a third NAND means for performing a logic NAND operation with respect to an inverted signal produced from said second NAND means and the output node signal of said output node driver.

4. An output buffer of semiconductor memory device according to claim 3, wherein said driving means comprises:
   a third NOR means for performing a logic NOR operation with respect to the signals produced from said first and said second NOR means; and
   a fourth NAND means for performing a logic NAND operation with respect to a signal produced from said first NAND means and a signal produced from said third NAND means.

5. An output buffer of semiconductor memory device according to claim 3, wherein a logic threshold voltage of said second NOR means is slightly lower than the mid-level of the power supply voltage and the ground voltage.

6. An output buffer of semiconductor memory device according to claim 3, wherein a logic threshold voltage of said third NAND means is slightly higher than the mid-level of the power supply voltage and the ground voltage.

* * * * *